US012573582B2

(12) United States Patent
Dudovitch et al.

(10) Patent No.: US 12,573,582 B2
(45) Date of Patent: Mar. 10, 2026

(54) MOVEABLE SUPPORT TO SECURE ELECTRICALLY CONDUCTIVE AND NONCONDUCTIVE SAMPLES IN A VACUUM CHAMBER

(71) Applicant: Applied Materials Israel Ltd., Rehovot (IL)

(72) Inventors: Ofer Dudovitch, Ganey Yohanan (IL); Erez Admoni, Petach Tikva (IL)

(73) Assignee: Applied Materials Israel Ltd., Rehovot (IL)

( * ) Notice: Subject to any disclaimer, the term of this patent is extended or adjusted under 35 U.S.C. 154(b) by 389 days.

(21) Appl. No.: 18/115,689

(22) Filed: Feb. 28, 2023

(65) Prior Publication Data

US 2024/0290572 A1 Aug. 29, 2024

(51) Int. Cl.
*H01J 37/20* (2006.01)
*H01L 21/683* (2006.01)

(52) U.S. Cl.
CPC .......... *H01J 37/20* (2013.01); *H01L 21/6833* (2013.01); *H01J 2237/2007* (2013.01); *H01J 2237/20235* (2013.01)

(58) Field of Classification Search
CPC ................. H01J 37/32715; H01J 37/20; H01J 2237/2007; H01J 2237/20235; H01L 21/6833
See application file for complete search history.

(56) References Cited

U.S. PATENT DOCUMENTS 5,055,964 A * 10/1991 Logan .................... H02N 13/00
29/829
5,677,824 A * 10/1997 Harashima .......... H01L 21/6831
118/723 R
(Continued)

FOREIGN PATENT DOCUMENTS

JP 2001077180 A 3/2001
JP 3942318 B2 * 7/2007
(Continued)

OTHER PUBLICATIONS

PCT/US2024/017247, "International Search Report and Written Opinion", Jun. 25, 2024, 11 pages.
(Continued)

*Primary Examiner* — Wyatt A Stoffa
(74) *Attorney, Agent, or Firm* — Kilpatrick Townsend & Stockton LLP

(57) ABSTRACT

A chuck that supports a sample in a processing chamber and comprises: a support plate formed from a dielectric material, the support plate including an upper planar support surface sized and shaped to retain a substrate disposed on the support plate; one or more electrodes disposed within the support plate proximate the upper planar support surface; a plurality of lift pin holes formed completely through the support plate; a plurality of stub cavities formed within the support plate, each stub cavity having an opening at the upper planar support surface; a plurality of retractable stubs corresponding in number to the plurality of stub cavities, (Continued)

wherein each retractable stub is disposed in a unique one of the stub cavities; and a stub lift mechanism operable to move each retractable stub in the plurality of stubs between a down position and an up position, wherein in the down position a distal end of the retractable stub is disposed within its respective stub cavity and recessed below the upper planar support surface and the up position the distal end of the retractable stub protrudes above the upper planar support surface through the stub cavity opening.

6 Claims, 11 Drawing Sheets

(56) References Cited

U.S. PATENT DOCUMENTS

| | | | | |
|---|---|---|---|---|
| 7,204,888 | B2 | 4/2007 | Tran et al. | |
| 7,430,104 | B2 | 9/2008 | Litman et al. | |
| 7,845,897 | B2 * | 12/2010 | Agou | H01L 21/67742 |
| | | | | 414/217 |
| 8,804,299 | B2 * | 8/2014 | Eytan | H01L 21/6875 |
| | | | | 361/230 |
| 9,117,867 | B2 | 8/2015 | Hwang et al. | |
| 11,545,387 | B2 * | 1/2023 | Inhofer | H01L 21/68742 |
| 12,020,968 | B2 * | 6/2024 | Kawawa | C23C 14/50 |
| 2002/0180466 | A1 * | 12/2002 | Hiramatsu | H01L 21/67103 |
| | | | | 219/209 |
| 2005/0252454 | A1 | 11/2005 | Parkhe et al. | |
| 2006/0240542 | A1 * | 10/2006 | Schieve | H01L 21/68742 |
| | | | | 435/287.2 |
| 2007/0201180 | A1 | 8/2007 | Nakash | |
| 2007/0211402 | A1 * | 9/2007 | Sawataishi | H02N 13/00 |
| | | | | 361/234 |
| 2008/0217291 | A1 * | 9/2008 | Higuma | H01L 21/6875 |
| | | | | 216/38 |
| 2010/0075488 | A1 * | 3/2010 | Collins | H01L 21/67115 |
| | | | | 438/584 |
| 2016/0020134 | A1 * | 1/2016 | Thirunavukarasu | |
| | | | | C23C 16/4586 |
| | | | | 438/758 |
| 2017/0186631 | A1 * | 6/2017 | Thirunavukarasu | |
| | | | | H01J 37/32082 |
| 2025/0104248 | A1 * | 3/2025 | Dudovitch | G06T 11/00 |

FOREIGN PATENT DOCUMENTS

| | | | |
|---|---|---|---|
| KR | 20060078545 | A | 7/2006 |
| KR | 20130131595 | A | 12/2013 |

OTHER PUBLICATIONS

PCT/US2024/017247, "International Preliminary Report on Patentability", Sep. 11, 2025, 7 pages.

* cited by examiner

MOVEABLE SUPPORT TO SECURE ELECTRICALLY CONDUCTIVE AND NONCONDUCTIVE SAMPLES IN A VACUUM CHAMBER

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen of an electronic structure such as a silicon wafer can be analyzed in a scanning electron microscope (SEM) to study a specific characteristic feature in the wafer. Such a characteristic feature may include the circuit fabricated and any defects formed during the fabrication process. An electron microscope is one of the most useful pieces of equipment for analyzing the microscopic structure of semiconductor devices.

An SEM instrument can capture images of a region on a sample by positioning a sample in a vacuum chamber, generating a charged particle beam and illuminating the sample with the beam while the sample is positioned on a sample support structure within the vacuum chamber. Particles emitted due to the illumination can then be detected in order to generate an SEM image of the region illuminated by the charged particle beam.

It is common for SEM images to be taken at multiple locations on a sample during failure analysis and/or device validation processes. The charged particle column in an SEM instrument is typically in a fixed position within the vacuum chamber. Thus, to image multiple locations on a sample, the sample support can move the sample along the X and Y axes in order to position the area of the sample being imaged directly under the field of view of the charged particle column.

When obtaining an SEM image, it is important that the sample be secured in the vacuum chamber on the sample support such that the sample does not shift or otherwise move when the sample support moves the sample to image the next location on the sample. Currently some known SEM instruments include different types of sample support structures (referred to herein as "chucks") depending on the electrical characteristics of the sample being imaged. For example, when imaging electrically conductive samples (e.g., semiconductor wafers) the sample support structure can be an electrostatic chuck (sometimes referred to herein as an "eChuck"). When imaging samples that are not electrically conductive (e.g., dielectric wafers such as glass or sapphire wafers), the sample support structure can be a stub chuck (sometimes referred to herein as an "sChuck") that supports the sample above the chuck surface on a plurality of pins or "stubs". Thus, certain SEM instruments can only reliably be used to image samples of a certain type depending on the sample support structure that is installed within the vacuum chamber of the instrument.

Accordingly, new and improved methods and systems for supporting a sample in a substrate processing chamber, such as an SEM instrument, are desirable.

BRIEF SUMMARY OF THE INVENTION

Embodiments described herein provide methods and systems for securely supporting both electrically conductive and electrically nonconductive samples on the same sample support (sometimes referred to herein as a "chuck") within a vacuum chamber of an instrument, such as a scanning electron microscope. While embodiments of the disclosure can be used to support many different types of electrically conductive and electrically nonconductive samples within a vacuum chamber, some embodiments are particularly useful for supporting both samples that are dielectric wafers and samples that are semiconductor wafers on the same sample support in the vacuum chamber of a sample analysis tool that includes one or more charged particle columns.

In some embodiments, a chuck that supports a sample in a processing chamber is provided. The chuck can include: a support plate formed from a dielectric material; a plurality of lift pin holes formed completely through the support plate; a plurality of stub cavities formed within the support plate. The support plate can include an upper planar support surface sized and shaped to retain a substrate disposed on the support plate and each stub cavity can have an opening at the upper planar support surface. The chuck can further include: one or more electrodes disposed within the support plate proximate the upper planar support surface; a plurality of retractable stubs corresponding in number to the plurality of stub cavities, where each retractable stub is disposed in a unique one of the stub cavities; and a stub lift mechanism operable to move each retractable stub in the plurality of stubs between a down position and an up position, wherein in the down position a distal end of the retractable stub is disposed within its respective stub cavity and recessed below the upper planar support surface and the up position the distal end of the retractable stub protrudes above the upper planar support surface through the stub cavity opening.

In some embodiments, a system for evaluating a sample is provided. The system can include: a vacuum chamber; a sample support disposed within the vacuum chamber and operable to hold a sample during a sample evaluation process; a charged particle column configured to direct a charged particle beam into the vacuum chamber toward a sample positioned on the sample support; and a moveable stage configured to move the sample support within the vacuum chamber in the X, Y and Z directions. The sample support can include: a support plate formed from a dielectric material; a plurality of lift pin holes formed completely through the support plate; a plurality of stub cavities formed within the support plate. The support plate can include an upper planar support surface sized and shaped to retain a substrate disposed on the support plate and each stub cavity can have an opening at the upper planar support surface. The sample support can further include: one or more electrodes disposed within the support plate proximate the upper planar support surface; a plurality of retractable stubs corresponding in number to the plurality of stub cavities, where each retractable stub is disposed in a unique one of the stub cavities; and a stub lift mechanism operable to move each retractable stub in the plurality of stubs between a down position and an up position, wherein in the down position a distal end of the retractable stub is disposed within its respective stub cavity and recessed below the upper planar support surface and the up position the distal end of the retractable stub protrudes above the upper planar support surface through the stub cavity opening.

Various embodiments of the chuck and/or the system for evaluating a sample can include one or more of the following features. Each retractable stub can be coupled to a biasing mechanism disposed within its respective stub cavity and configured to bias the retractable stub in the down position. The biasing mechanism can comprise a coil spring. The stub lift mechanism can move all of the retractable stubs in the plurality of retractable stubs between the up and down position together. The stub lift mechanism can include a rotatable annular body and a plurality of ball bearings. Each ball bearing in the plurality of ball bearings can be positioned below a unique one of the retractable stubs. The stub lift mechanism can be operable to apply a force to the ball bearing to move its respective retractable stub in the up position. The stub lift mechanism can further include a plurality of recessed tracks formed in the annular ring. Each recessed track can have a deep end and a shallow end and a sloped surface extending between the deep and shallow ends. Each ball bearing in the plurality of ball bearings can sit within a unique one of the recessed tracks in the plurality of tracks. The stub actuator system can further include an actuator operably coupled to rotate the annular body in first and second opposing directions such that the ball bearing in each recessed track moves up and down in response to the sloped surface. Each retractable stub further can further include a bearing housing that includes one or more walls that surround the bearing positioned below the retractable stub such that the one or more walls prevent the bearing from rotating with the annular body. The stub lift mechanism can include a plurality of stub actuators including a separate stub actuator for each retractable stub. The stub lift mechanism can be operable to raise and lower each retractable stub in the plurality of retractable stubs between the up and down positions independent of the other retractable stubs. The one or more electrodes can include at least two electrodes.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments described herein provide methods and systems for securely supporting both electrically conductive and electrically nonconductive samples on the same sample support within a vacuum chamber of an instrument, such as a scanning electron microscope. While embodiments of the disclosure can be used to support many different types of electrically conductive and electrically nonconductive samples within a vacuum chamber, some embodiments are particularly useful for supporting both samples are dielectric wafers and samples that are semiconductor wafers in the vacuum chamber of a sample analysis tool that includes one or more charged particle columns.

Example Sample Evaluation Tool

Figure 1:
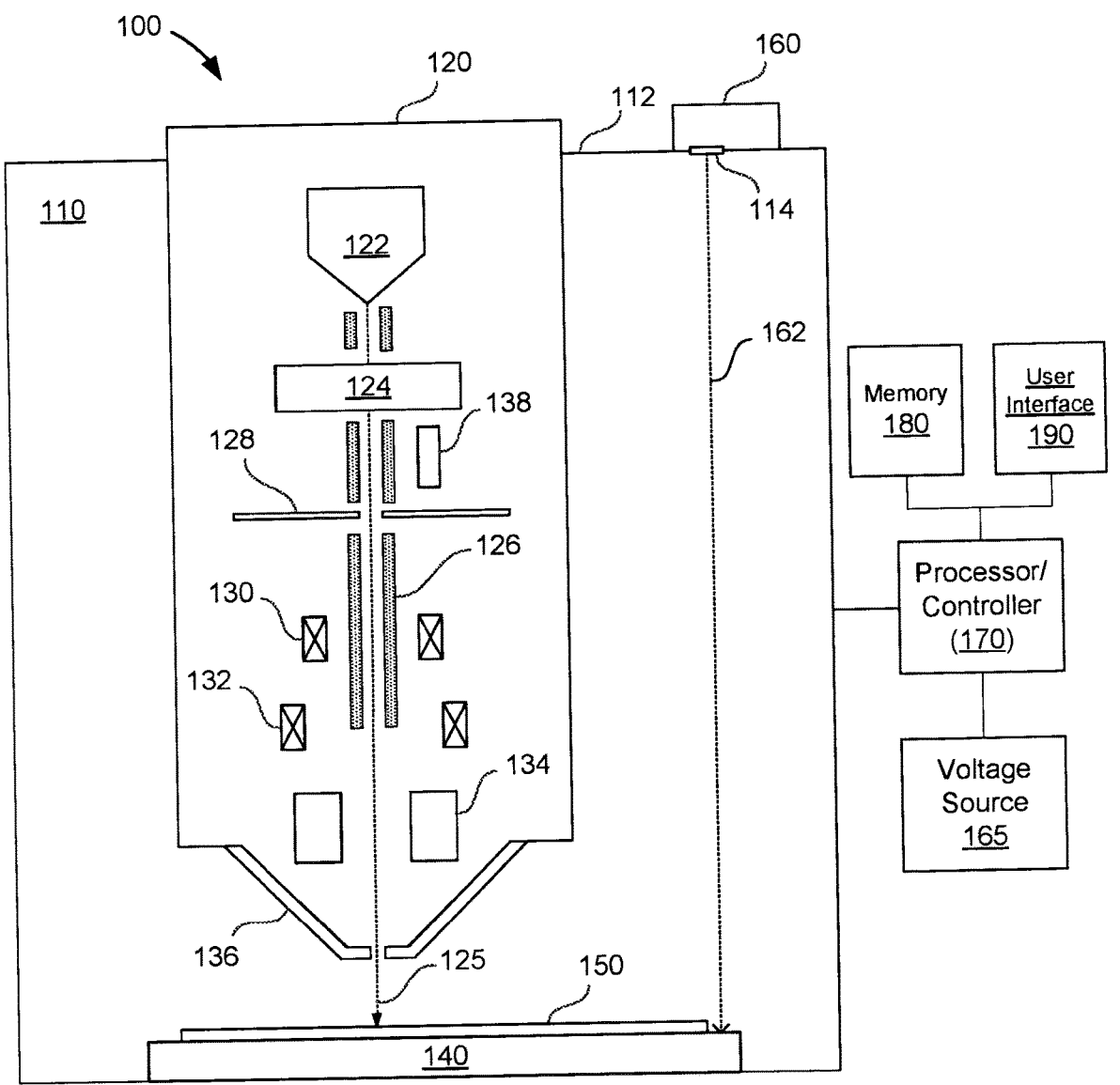
FIG. 1 is simplified illustration of a sample evaluation system that includes a scanning electron microscope (SEM) column.

In order to better understand and appreciate the disclosure, reference is first made to FIG. 1, which is a simplified schematic illustration of a previously known sample evaluation system 100. Sample evaluation system 100 can be used for, among other operations, defect review and analysis of structures formed on samples, such as semiconductor or dielectric wafers.

System 100 can include a vacuum chamber 110 along with a scanning electron microscope (SEM) column 120. A supporting element 140 can support a sample 150 (e.g., a semiconductor wafer) within chamber 110 during a processing operation in which the sample 150 (sometimes referred to herein as an "object" or a "specimen") is subject to a charged particle beam 126 from the SEM column.

SEM column 120 is connected to vacuum chamber 110 so that charged particle beam generated by the column propagates through a vacuumed environment formed within vacuum chamber 110 before impinging on sample 150. SEM column 120 can generate an image of a portion of sample 150 by illuminating the sample with charged particle beam 125, detecting particles emitted due to the illumination, and generating charged particle images based on the detected particles. Towards this end, SEM column 120 can include an electron beam source 122 (i.e., an "electron gun"), an anode tube 126 that defines the electron beam drift space, a condenser lens arrangement 124, one or more deflecting lenses, such as lenses 130, 132, one or more focusing lenses 134, and a column cap 136.

During an imaging process, electron beam source 122 generates an electron beam 125 that passes through and is initially converged by the condenser lens 124 and then focused by lenses 134 before hitting the sample 150. Condenser lens 124 defines the numerical aperture and current of the electron beam (together with the final aperture) which is directly related to the resolution, while focusing lenses 134 focus the beam onto the sample. Column cap 136, which is located between the lower end of anode tube 126 (a first electrode) and the sample 150 (a second electrode) can be a third electrode in the system that regulates the electric field created within the vicinity of the wafer.

FIG. 1 depicts SEM column 120 generating a charged particle beam 125 that is generally orthogonal to sample 150 when the beam collides with the sample. In various embodiments, SEM column 120 can be operated in a tilted mode where charged particle beam 125 collides with sample 150 at a non-vertical angle, such as a 45 degree angle.

In both regular and tilted modes, the particle imaging process typically includes scanning a charged particle beam back-and-forth (e.g., in a raster or other scan pattern) across a particular area of the sample being imaged. Deflecting lenses 130, 132, which can be magnetic lenses, electrostatic lenses or a combination of both electrical and magnetic lenses, can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

SEM column 120 can also include one or more detectors to detect charged particles generated from the sample during an imaging process. For example, SEM column 120 can include an in-lens detector 128 and a top detector 138 that can be configured to detect secondary and backscattered electrons emitted as a result of an illumination of the sample by charged particle beam 126. In-lens detector 128 can include a central hole that allows charged particle beam 126 to pass through the detector and allows both secondary electrons and backscattered electrons that enter the charged particle column 120 to pass through detector 128 to top detector 138. In some embodiments, sample evaluation system 120 can also include an external detector that can also be configured to detect secondary and backscattered electrons or that can be configured to detect x-rays, such as x-ray spectroscopy (EDX) detector.

During operation of system 100, sample support 140 (sometimes referred to herein as a "stage") can move the sample such that different portions (e.g., different regions of interest or "ROIs") are positioned directly under the field of view of SEM column 120. Sample support 140 can move sample 150 within chamber 110 relatively rapidly both left and right and forward and back (i.e., along both the X and Y axis) and can also raise and lower sample 150 thus moving the sample along the Z axis.

Since many features formed on sample 150 have dimensions at the micron size or smaller, it is important that location of the sample relative to the focal point of SEM column 120 be precisely known. In order to precisely determine the location of sample 150, a stage-accurate navigation, interferometry system 160 can be used in some embodiments. System 160 can be mounted on a lid 112 of chamber 110 and direct collimated light (e.g., a laser beam) through a window 114 formed on the lid to a target area on sample support 140 that is encoded with various linear or other marks. The system can detect light (e.g., with an array of photodetectors) from the collimated light pulses after being reflected off the encoded target area of sample support 140 back to system 160. Then, a processor within system 160 (e.g., digital signal processor) can analyze the detected light signals to determine a highly accurate location of the sample along the X and Y axis.

Additionally, system 100 can include a voltage supply source 165 and one or more controllers 170, such as a processor or other hardware unit. Voltage supply source 165 can be operated to provide a desired effective voltage of the column to thereby improve the image resolution. This can be achieved by appropriate distribution of the voltage supply between the first and second electrodes (i.e., between the anode tube and the sample). Controller(s) 170 can control the operation of system, including the voltage supply source, by executing computer instructions stored in one or more computer-readable memories 180 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

System 100 can further include a user interface 190 that can enable one or more users to interact with the system. For example, user interface 190 can allow a user to set parameters of the SEM column or the detectors that can be used when analyzing a sample. The user interface 190 can include any known device or devices that enable a user to input information to interact with a computer system such as a keyboard, a mouse, a monitor, a touch screen, a touch pad, a voice activated input controller and the like.

When an SEM instrument, such as system 100, is used to image or otherwise evaluate a sample, it can be important that the working distance between the column tip and sample be precisely known. As used herein, the "working distance" between a charged particle column and a sample is the distance between the electrode of the lens arrangement closest to the sample's plane (i.e., the cap electrode in some examples below) and the sample's plane.

Example Sample Supports

As mentioned in the Background section, in some known SEM instruments sample support 140 is either an electrostatic chuck or a stub chuck depending on whether evaluation system 100 is optimized to evaluate electrically conductive samples or electrically nonconductive (dielectric) samples.

1. Electrostatic Chuck

Figure 2A:
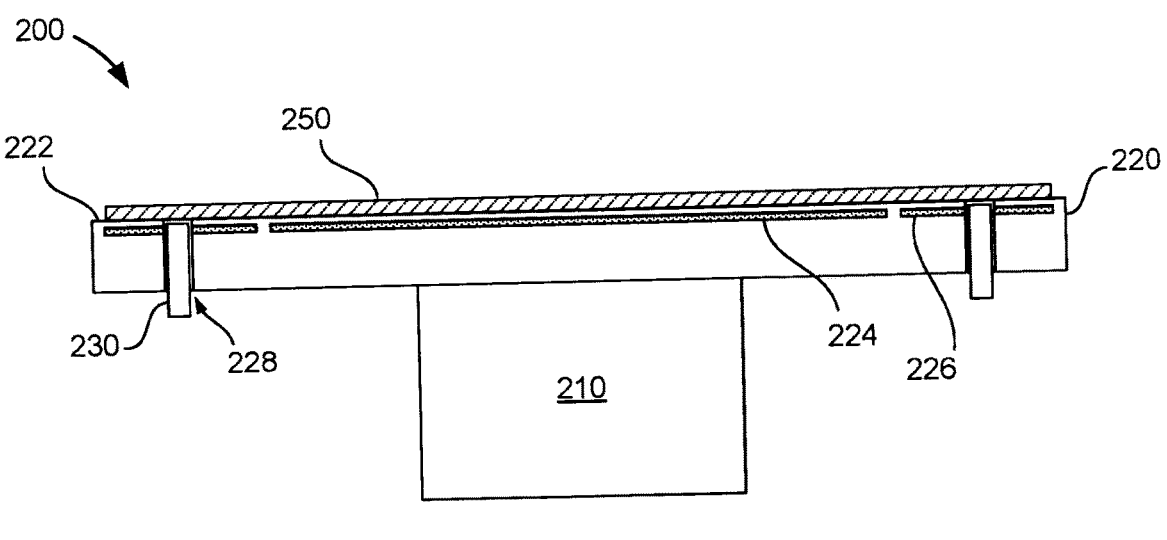
FIGS. 2A and 2B are simplified cross-sectional views of an electrostatic chuck with lift pins in down and up positions, respectively.
Figure 2B:
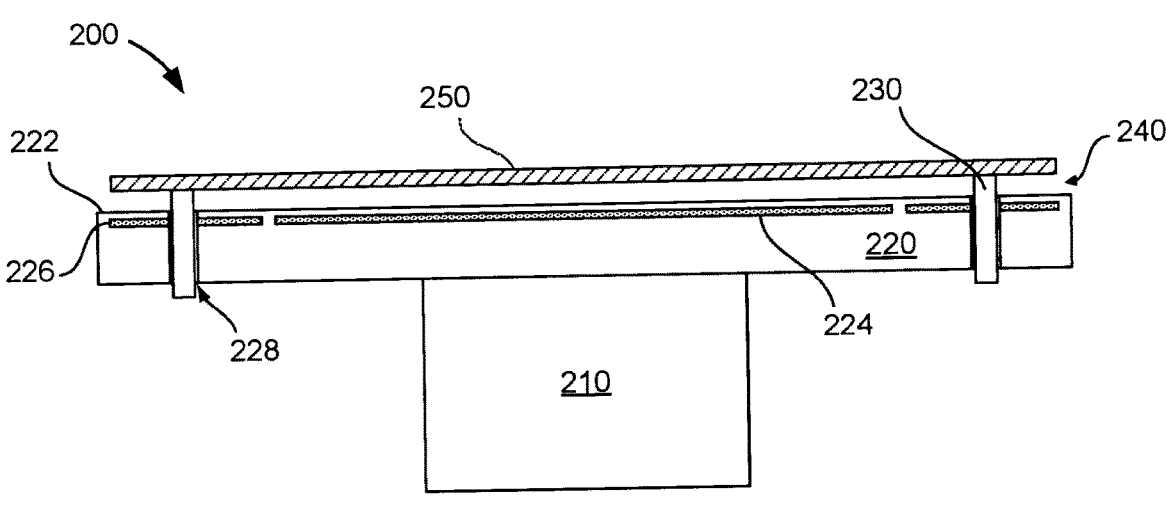

FIGS. 2A and 2B are simplified illustrations of an electrostatic chuck 200 that some previously known sample evaluation system use to support electrically conductive samples, such as semiconductor wafers, in a vacuum chamber during a sample evaluation process. Referring first to FIG. 2A, electrostatic chuck 200 includes a moveable stage 210 coupled to a support plate 220. Support plate 220 has a planar support surface 222 on which a sample 250 (e.g., a wafer such as a semiconductor wafer) can be positioned during an evaluation or other type of analysis operation.

Stage 210 can move support plate 220 (and thus move sample 250) within vacuum chamber 110 in the X, Y and Z directions in order to position a region of interest on the sample directly beneath the field of view of a charged particle column, such as charged particle column 120. Plate 220 can be made from a dielectric material, such as a ceramic material, and one or more electrodes 224, 226, can be disposed beneath surface 222. When sample 250 is a semiconductor wafer or other electrically conductive sample, a voltage can be applied to the electrodes 224, 226 to clamp the sample to the planar support surface 222 as shown in FIG. 2A securing the sample to the support plate 220 so that the sample will not shift or otherwise move when stage 210 moves the sample support within vacuum chamber 110. Clamping sample 250 in this manner can also beneficially, flatten the sample to ensure an accurate working distance across all regions of the sample.

Support plate 220 can also include multiple lift pin holes 228 and a corresponding number of lift pins 230 to facilitate transfer of the sample 250 into and out of a sample evaluation system. As shown in FIGS. 2A and 2B, each lift pin hole 228 can extend entirely through support plate 220. And, while not shown in FIG. 2A or 2B, the lift pins 230 can be attached in a fixed position with respect to a portion of stage 210 so that the lift pins can move in the X and Y directions with support plate 220 while at the same time allowing stage 210 to raise and lower the support plate 220 in the Z direction without moving lift pins 230. In this manner, support plate 220 can be lowered so that a distal end of each lift pin 230 protrudes through its respective lift pin hole 228 holding the sample 250 above upper surface 222 of support plate 220 thereby creating a gap 240 between upper surface 222 of support plate 220 and a bottom surface of sample 250 as shown in FIG. 2B. When the chuck is then sufficiently raised (e.g., to the position shown in FIG. 2A), each lift pin 230 recedes into its respective lift pin hole 228 of the support plate 220 and the sample 250 rests on upper surface 222.

Having the lift pins 230 in the raised position shown in FIG. 2B allows a robot arm or similar substrate transfer device (not shown) to transfer sample 250 into the vacuum chamber, drop the sample onto lift pins 230 and retract out of the vacuum chamber. Support plate 220 can then be raised to position the sample 250 on upper surface 222 and one or more regions on the sample can be evaluated or otherwise analyzed as discussed above. Once the evaluation processes are completed on a given sample 250, the support plate can be lowered such that sample 250 is lifted onto lift pins 230 and the gap 240 that is created between the sample and support surface 222 enables the robot arm (not shown) to pick sample 250 up off the lift pins and transfer the sample out of the chamber.

While two lift pin holes 228 and two corresponding lift pins 230 are shown in the cross-sectional views of FIGS. 2A and 2B, a typical electrostatic chuck 200 will include at least three lift pin holes 228 and three lift pins 230 that are disposed at intervals around a periphery of support plate 220. For example, in some implementations, electrostatic chuck 200 can include three lift pin holes 228 and three lift pins 230 spaced apart from each other at 120 degree angles.

2. Stub Chuck

As described above in conjunction with the discussion of FIGS. 2A and 2B, when a sample is electrically conductive, electrostatic chuck 200 can clamp the sample to the chuck with electrodes 224, 226 allowing stage 210 to rapidly move the sample within a vacuum chamber to a specific position so that a desired region of interest of the sample is directly under the field of view of a charged particle column. When the sample is a dielectric (electrically nonconductive) sample, however, it cannot be electrostatically clamped by electrodes 224, 226. Thus, in order to prevent a dielectric sample from shifting or otherwise undesirably moving on the sample support while the sample support is being rapidly moved within a processing chamber, a stub chuck can be employed.

Figures 3A, 3B:
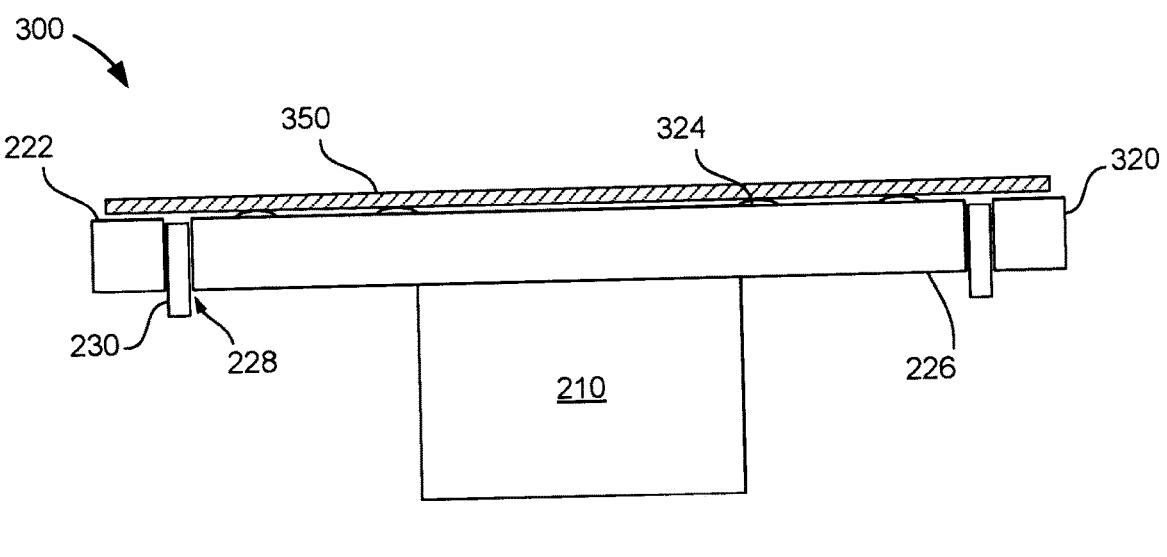
FIGS. 3A and 3B are simplified cross-sectional views of a stub chuck with lift pins in down and up positions, respectively.

FIGS. 3A and 3B are simplified illustrations of a stub chuck 300 that some previously known sample evaluation system use to support dielectric (non-electrically conductive) samples, such as sapphire wafers, in a vacuum chamber during a sample evaluation process. Stub chuck 300 can include some components that are similar to those described above with respect to electrostatic chuck 200. Thus, for sake of brevity such similar components are given the same reference numbers in FIGS. 3A, 3B as in FIGS. 2A, 2B and not described in detail below.

One difference between stub chuck 300 and electrostatic chuck 200, however, is that instead of including electrodes 224, 226 to secure the sample as the sample is moved about within a chamber by stage 210, stub chuck 300 includes multiple stubs 324 that support the sample slightly above (e.g., one millimeter or less) an upper surface 322 of a sample support plate 320. Each stub 324 can include a hard rubber or similar surface that provides a relatively high degree of friction between sample 350 and the stub such that the sample will not shift or otherwise move with respect to support plate 320 as the sample is rapidly moved by stage 210 within the processing chamber.

As shown in FIGS. 3A and 3B, stub chuck 300 also includes lift pin holes 228 and lift pins 230 that operate as described above with respect to FIGS. 2A and 2B.

Bridge Chuck with Retractable Stubs

As mentioned in the Background section and discussed above with respect to FIGS. 2A to 3B, in some SEM instruments and other sample evaluation systems, sample support 140 is either an electrostatic chuck or a stub chuck depending on whether evaluation system 100 is optimized to evaluate electrically conductive samples or electrically nonconductive samples. Evaluations systems with such sample supports can thus only reliably analyze the particular type of sample the support is designed to secure: systems with an echuck evaluate electrically conductive samples while systems with stub chuck evaluate electrically nonconductive samples. Embodiments disclosed herein bridge deficiencies provided by each of the above chuck types and pertain to a sample support or chuck (sometimes referred to herein as a "bridge chuck") that can securely and reliably support both electrically conductive and electrically nonconductive samples within a sample evaluation system, such as sample evaluation system 100

Figure 4A:
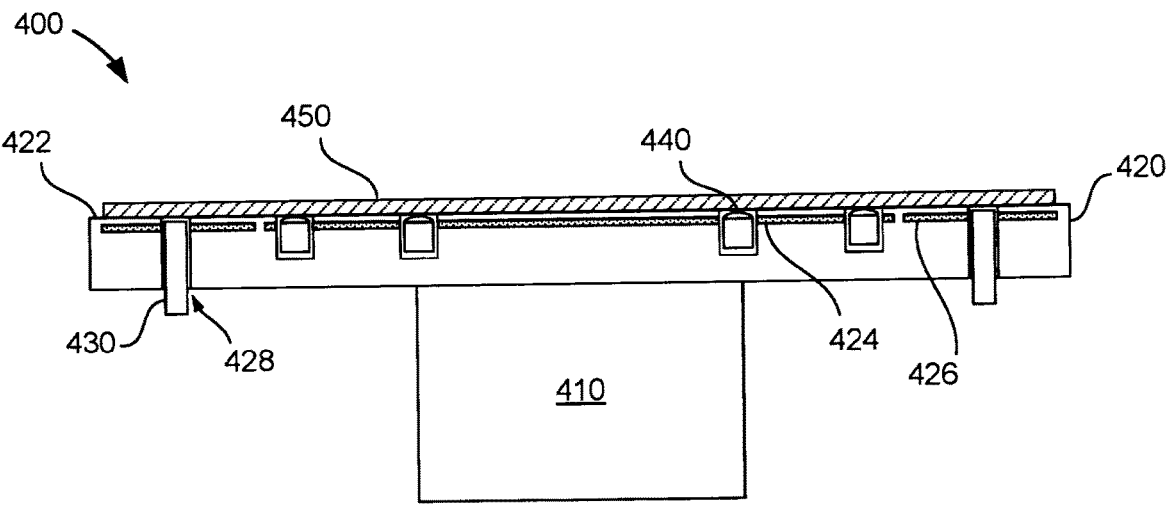
FIGS. 4A and 4B are simplified cross-sectional views of a bridge chuck according to embodiments disclosed herein.
Figure 4B:
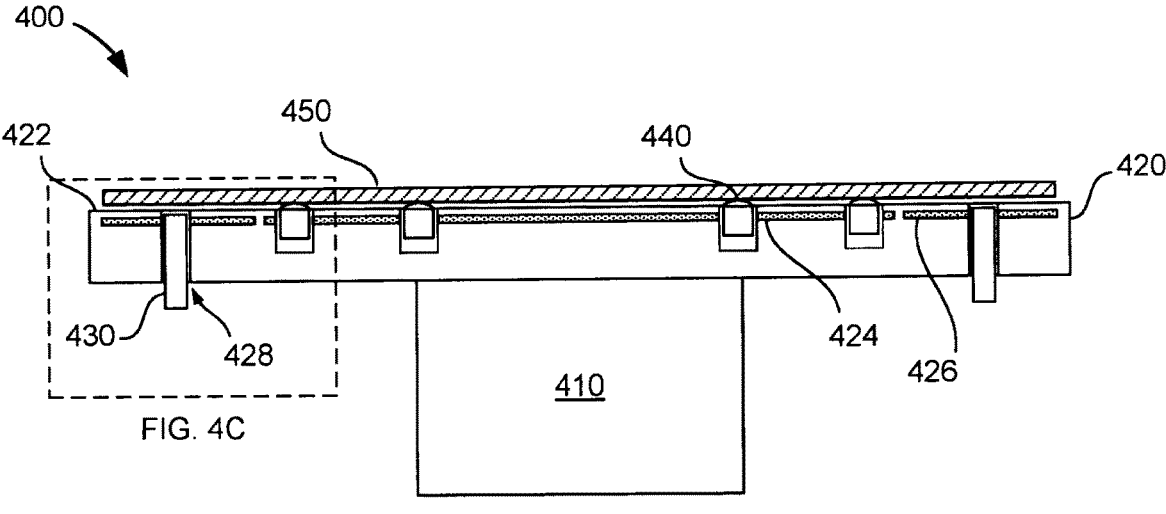

To illustrate, reference is first made to FIGS. 4A and 4B, which are simplified cross-sectional views of a bridge chuck 400 according to some embodiments. Bridge chuck 400 includes a moveable stage 410 coupled to a support plate 420. Moveable stage 410 can move the support plate 420 (and thus move a sample 450 supported on the plate) within a processing chamber (e.g., vacuum chamber 110) in the X, Y and Z directions in order to position a region of interest on the sample 450 directly beneath the field of view of a charged particle column (e.g., charged particle column 120). Support plate 420 can be made from a dielectric material, such as a ceramic material, and in some embodiments can be coated with titanium or similar material. Support plate 420 includes a planar support surface 422 on which a sample 450 can be positioned during a processing operation.

As shown in FIGS. 4A and 4B, bridge chuck 400 can includes one or more electrodes (e.g., electrodes 424, 426) disposed beneath surface 422. Bridge chuck 400 also includes a set of retractable stubs 440 positioned within support plate 420. As described in more detail below, the set of retractable stubs 440 can be controllably switched between up and down positions. In the down position the retractable stubs 440 are completely recessed within support plate 420 such that the entirety of each retractable stub 440 is at a level lower than that of upper surface 422. When the retractable stubs 440 are in the up position, the retractable stubs 440 protrude a short distance above upper surface 422 such that the sample 450 rests on the stubs 440 instead of resting on upper surface 422 of the support plate.

In operation, when sample 450 is a semiconductor wafer or other electrically conductive sample, retractable stubs 440 are set to the down position and a voltage can be applied to the one or more electrodes 424, 426 to clamp the sample to the planar support surface 422 as shown in FIG. 4A securing the sample to the support plate 420. The clamping force can be sufficient so that the sample will not shift or otherwise move when stage 410 moves the sample support within vacuum chamber 110. Clamping sample 450 in this manner can also, beneficially, flatten the sample to ensure an accurate working distance across all regions of the sample.

Figure 4C:
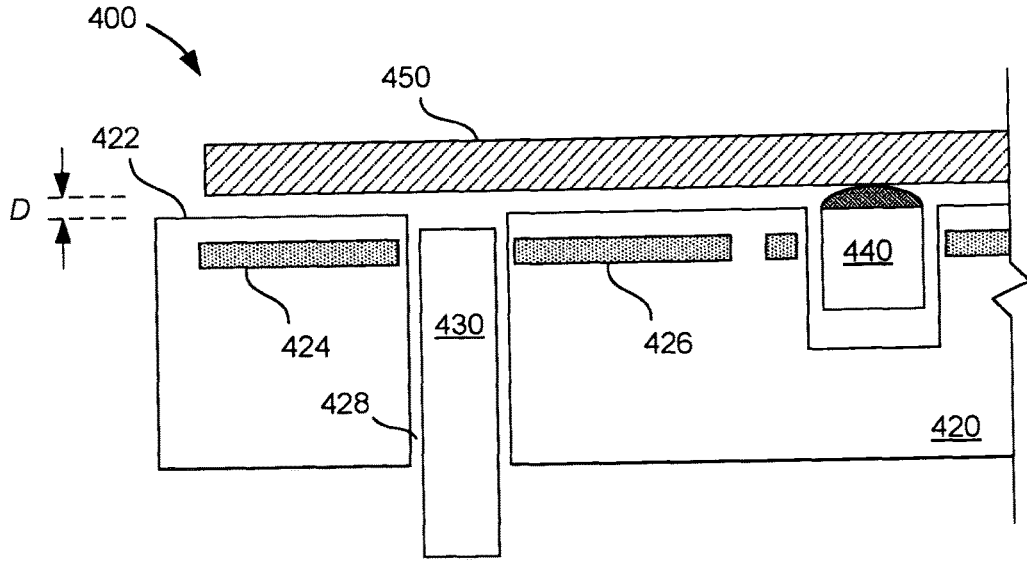
FIG. 4C is a simplified cross-sectional illustration of a portion of the bridge chuck shown in FIG. 4B with a sample resting on a retractable stub according to some embodiments disclosed herein.

When sample 450 is a dielectric wafer or other electrically nonconductive sample, retractable stubs 440 can be set to the up position so that the sample 450 rests slightly above the upper surface 422 of support plate 420 as shown in both FIG. 4B and FIG. 4C, which is an expanded view of a portion of bridge chuck 400 depicted in FIG. 4B. As a non-limiting example, during a sample evaluation process, in some embodiments the retractable stubs 440 can secure the sample a distance, D, one millimeter or less above upper surface 422 of a sample support plate 420, and in some embodiments, the retractable studs can secure sample 450 between 20-200 microns above the surface 422. Details of different embodiments of retractable stubs 440 are discussed below with respect to FIGS. 7 to 10.

Bridge chuck 400 can also include multiple lift pin holes 428 that extend through support plate 420 and a corresponding number of lift pins 430. The lift pins 430 facilitate the transfer of the sample 450 into and out of a sample evaluation system and thus serve a different purpose than retractable stubs 440. As shown in FIGS. 4A-4C, each lift pin hole 428 can extend entirely through support plate 420, i.e., from an opening in the lower surface to an opening in upper planar support surface 422. And, while not shown in the figures, the lift pins 430 can be attached in a fixed position with respect to a portion of stage 410 such that the lift pins 430 can be moved, by the stage, in the X and Y directions with support plate 420 while at the same time allowing stage 410 to raise and lower the support plate 420 in the Z direction without raising or lowering the lift pins 430 as discussed above with respect to lift pins 230. In this manner, support plate 420 can be lowered so that a distal end of each lift pin 430 protrudes through its respective lift pin hole 428 holding the sample 450 above upper surface 422 of support plate 420 thereby creating a gap 432 between upper surface 422 of support plate 420 and a bottom surface of sample 450 as shown in FIG. 5.

As shown, gap 432 is larger than the distance, D), that retractable stubs 440 create between the sample and surface 422. The increased height of gap 432 allows a robot arm to slide under sample 450 to transfer the sample into and out of the processing chamber. For example, a robot arm can transfer a sample into a processing chamber and position the sample on the lift pins. Once the robot arm is withdrawn from the processing chamber, the chuck can then be sufficiently raised (e.g., to the position shown in FIGS. 4A and 4B, such that each lift pin 430 recedes into its respective lift pin hole 428 of the support plate 420 leaving the sample 450 to rest on either upper surface 422 or retractable stubs 440 depending on whether the retractable stubs are in the up or down position.

Figure 5:
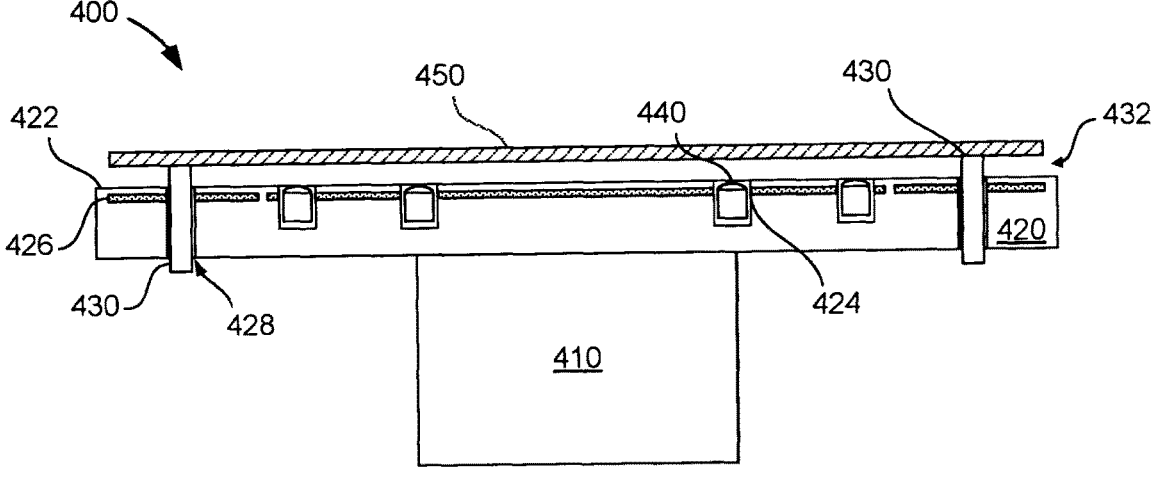
FIG. 5 is a simplified top view illustration of the bridge chuck depicted in FIGS. 4A and 4B according to some embodiments.

While two lift pin holes 428 and two corresponding lift pins 430 are shown in the cross-sectional views of FIGS. 4A, 4B and 5, bridge chucks according to embodiments disclosed herein can include any reasonable number of lift pin holes and lift pins. Some embodiments will typically include at least three lift pin holes 428 and three lift pins 430 that are disposed at equal intervals around a periphery of support plate 420. As non-limiting examples, in some implementations, bridge chuck 400 can include three lift pin holes 428 and three lift pins 430 spaced apart from each other at 120 degree angles. In other embodiments, bridge chuck 400 can include four lift pin holes 428 and four lift pins 430 spaced apart from each other at 90 degree angles.

Figure 6:
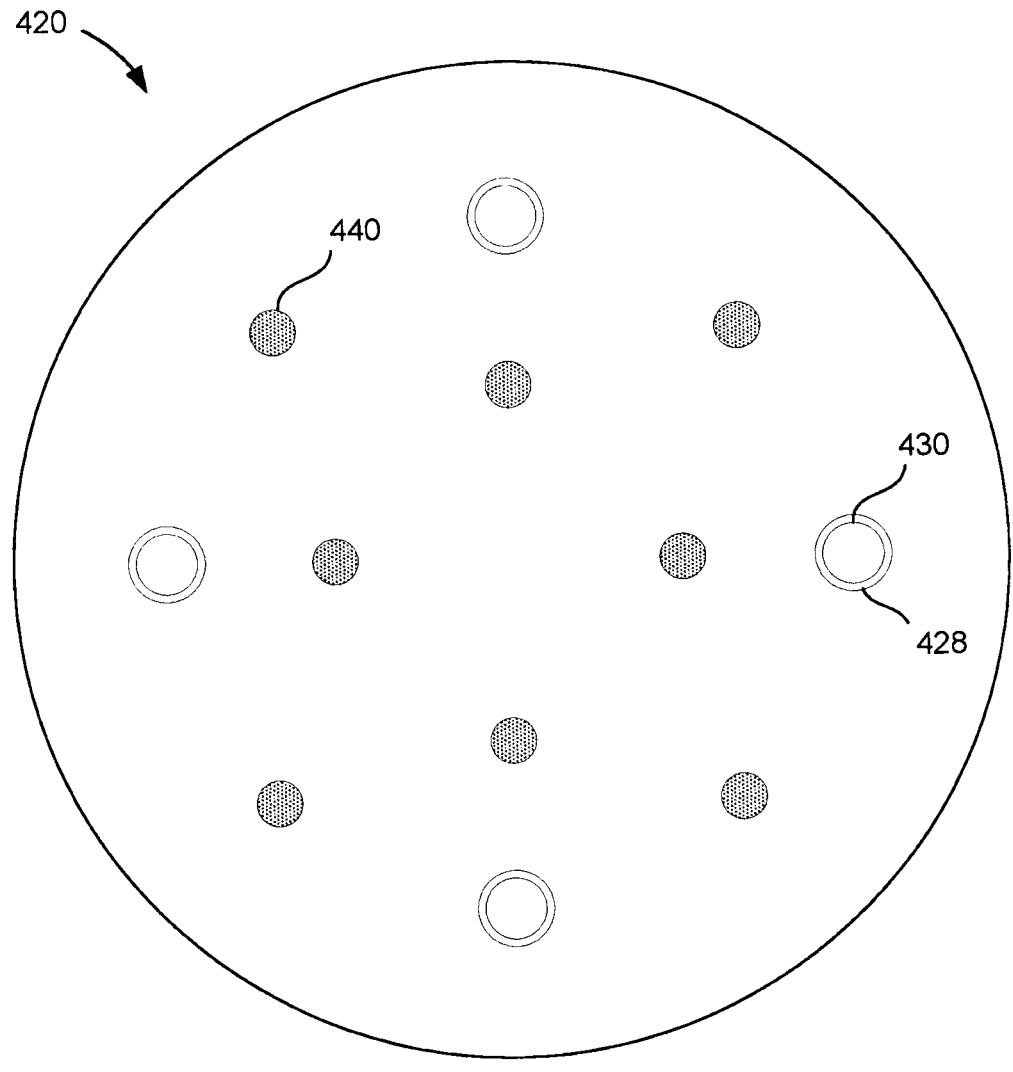
FIG. 6 is a top plan view of a sample support according to some embodiments disclosed herein.

Each retractable stub 440 can include a hard rubber or similar surface at its distal end that provides a relatively high degree of friction between sample 450 and the stub. While the cross-sectional views of FIGS. 4A and 4B depict four stubs, any appropriate number of stubs can be included and a typical bridge chuck will include a sufficient number of retractable stubs such that the multiple retractable stubs 440 combine to provide a sufficient amount of friction to sample 450 that the sample will not shift or otherwise move with respect to support plate 420 as the sample is moved by stage 410 within the processing chamber. As a non-limiting example, FIG. 6 is a simplified top plan view of a support plate 420 that includes eight retractable stubs 440 along with four lift pins 430. It is to be understood that FIG. 6 is for illustrative purposes only and embodiments disclosed herein are not limited to any particular number of retractable studs 440 or any particular number of lift pins 430. Embodiments are also not limited to any particular placement of the retractable studs or lift pins.

Figure 7:
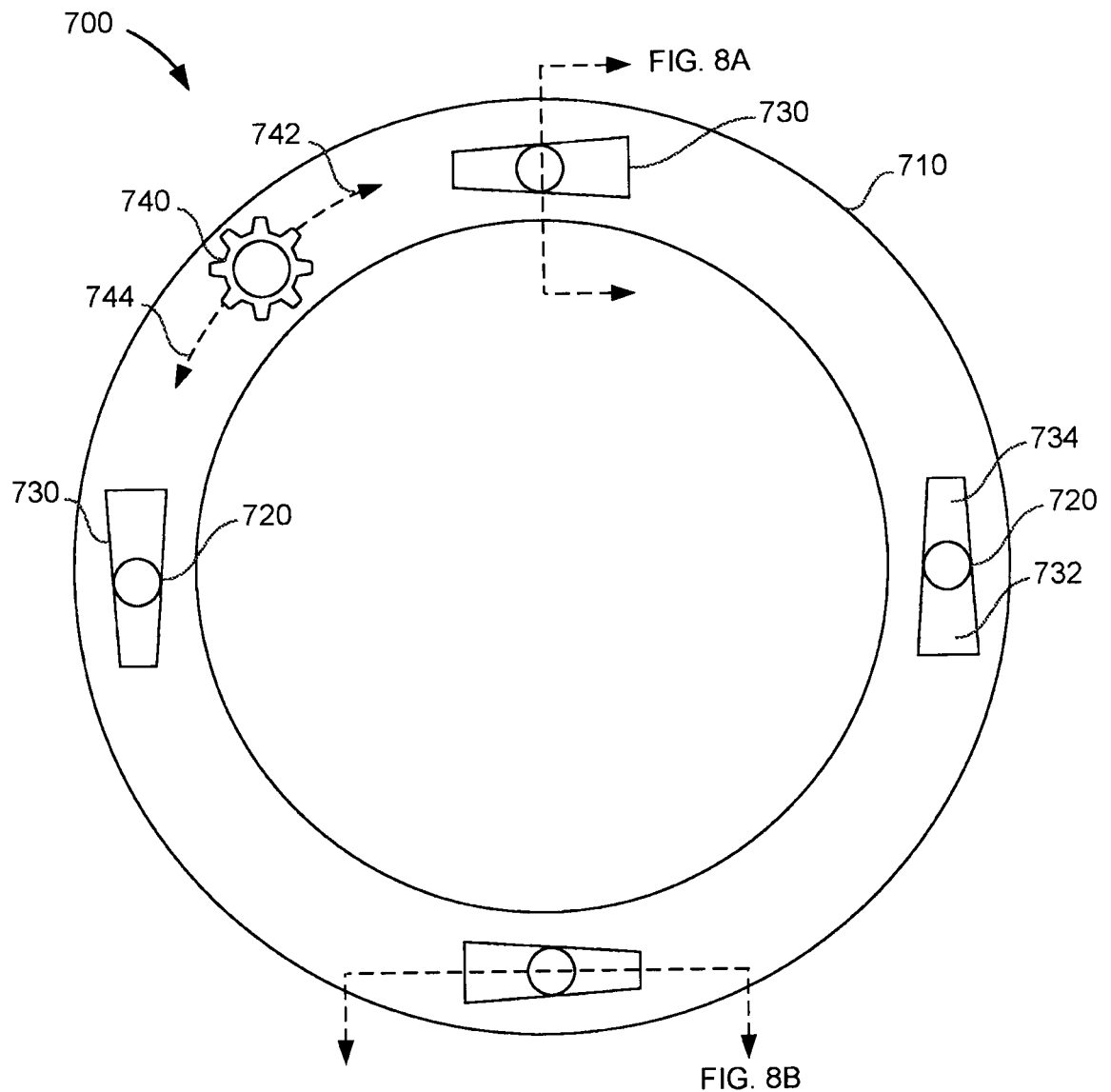
FIG. 7 is a simplified diagram depicting a stub actuator system according to some embodiments.

In some embodiments, the set of retractable stubs are biased to be set in the down position such that the retractable stubs 440 are recessed below support plate surface 422 and a stub lift mechanism (not shown in FIGS. 4A-4C or 5) can raise the stubs to the up position. FIG. 7 is a simplified diagram of one such stub lift mechanism 700 that can be switched to raise stubs 440 above support plate surface 422 and allow the retractable stubs 440 to be lowered below the support surface.

Stub Lift Mechanism

As shown, stub lift mechanism 700 includes a rotatable annular body 710 and multiple ball bearings 720. Each of the ball bearings 720 sits within a recessed track 730 that has a deep end 732 and a shallow end 734. Each ball bearing 720 and recessed track 730 can be paired with a unique one of the retractable stubs 440 such that each ball bearing 720 is positioned directly below and abuts a lower surface of its respective retractable stub 440.

An actuator 740 can rotate annular body 710 (and thus rotate the recessed tracks 730) a fixed distance in opposing directions as shown by arrows 742, 744. As the annular body 710 rotates, each ball bearing can be kept in place by a portion (e.g., a bearing housing) of its respective retractable pin (not shown in FIG. 7) so that the ball bearing moves within its respective track between the deep and shallow ends.

Figure 8A:
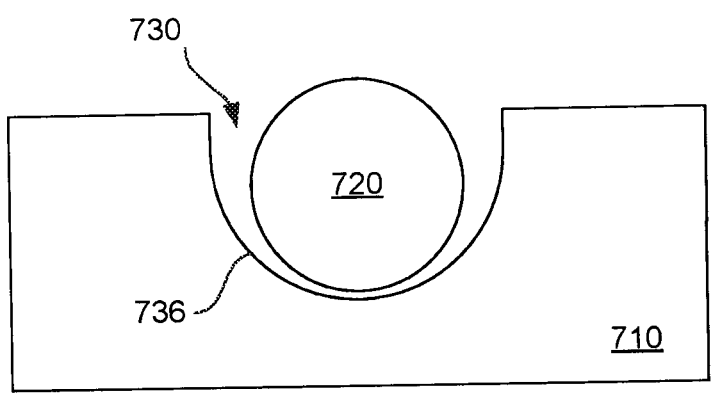
FIG. 8A is a simplified cross-sectional diagram of a bearing track shown in FIG. 7 taken along a first plane according to some embodiments.
Figure 8B:
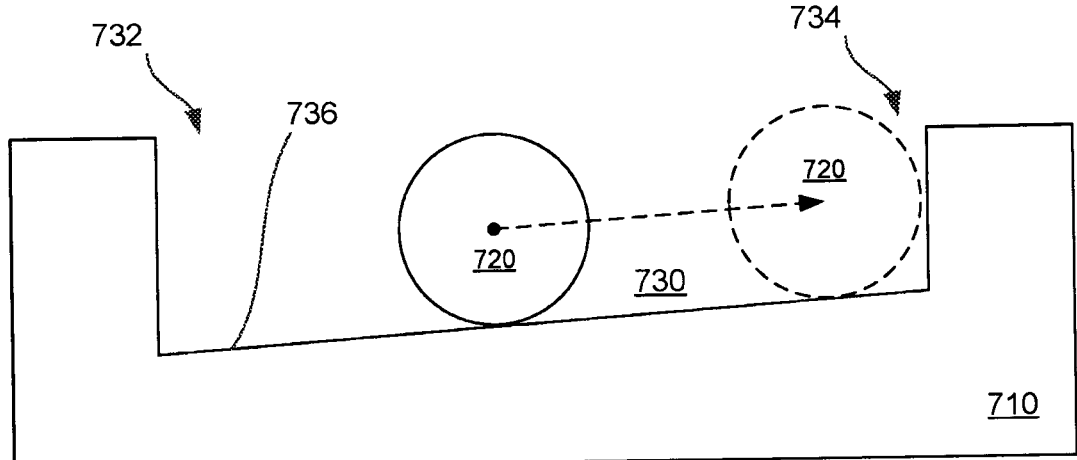
FIGS. 8B and 8C are a simplified cross-sectional diagrams of the bearing track shown in FIG. 8A taken along a second plane perpendicular to the first plane.
Figure 8C:
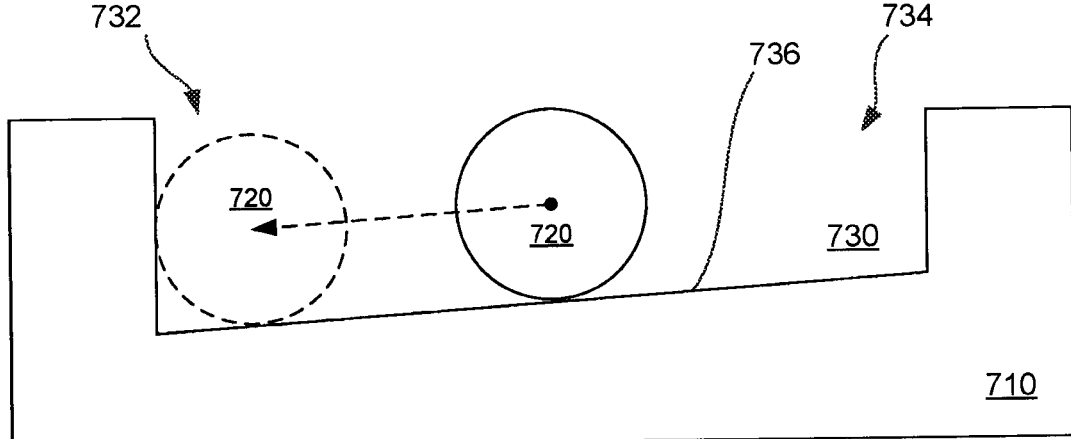

To illustrate, reference is made to FIGS. 8A to 8C. FIG. 8A is a simplified cross-sectional diagram of bearing track 710 along a first plane shown in FIG. 7 and FIGS. 8B and 8C are simplified cross-sectional diagram of bearing track 710 along a second plane shown in FIG. 7 perpendicular to the first plane. As shown in FIGS. 8A-8C, bearing track 710 can include a curved surface 736 that slopes upward from deep end 732 to shallow end 734. Ball bearing 720 can be operably coupled to its respective retractable stub 440 (not shown in any of FIG. 8A, 8B or 8C) such that the ball bearing 720 can rotate and/or spin while being held in a generally fixed position directly beneath its retractable stub 440. Thus, as the annular body 710 is rotated by actuator 740, the ball bearing 720 can move between the deep end 732 and shallow end 734 of track 730. For example, when actuator 740 moves annular ring in direction 742, ball bearing 720 can move to shallow end 734 as shown in FIG. 8B essentially lifting the retractable stub 440 that ball bearing 720 is paired with.

Similarly, when actuator 740 rotates annular body 710 in the opposite direction as shown by arrow 744, the ball bearing 720 can move towards the deep end 732 as shown in FIG. 8C) thus allowing the retractable stub 440 to be pushed downward, below surface 422 by a biasing mechanism as discussed below with respect to FIGS. 9A and 9B.

Referring back to FIG. 7, actuator 740 can be any appropriate device that imparts a force to rotate annular ring 710 in the directions 742, 744. For example, in various embodiments actuator 740 can be a motor and linear screw, a linear bearing, a servo actuator, a piezoelectric actuator, an electromagnetic device or other type of actuator.

Retractable Stubs

Figure 9A:
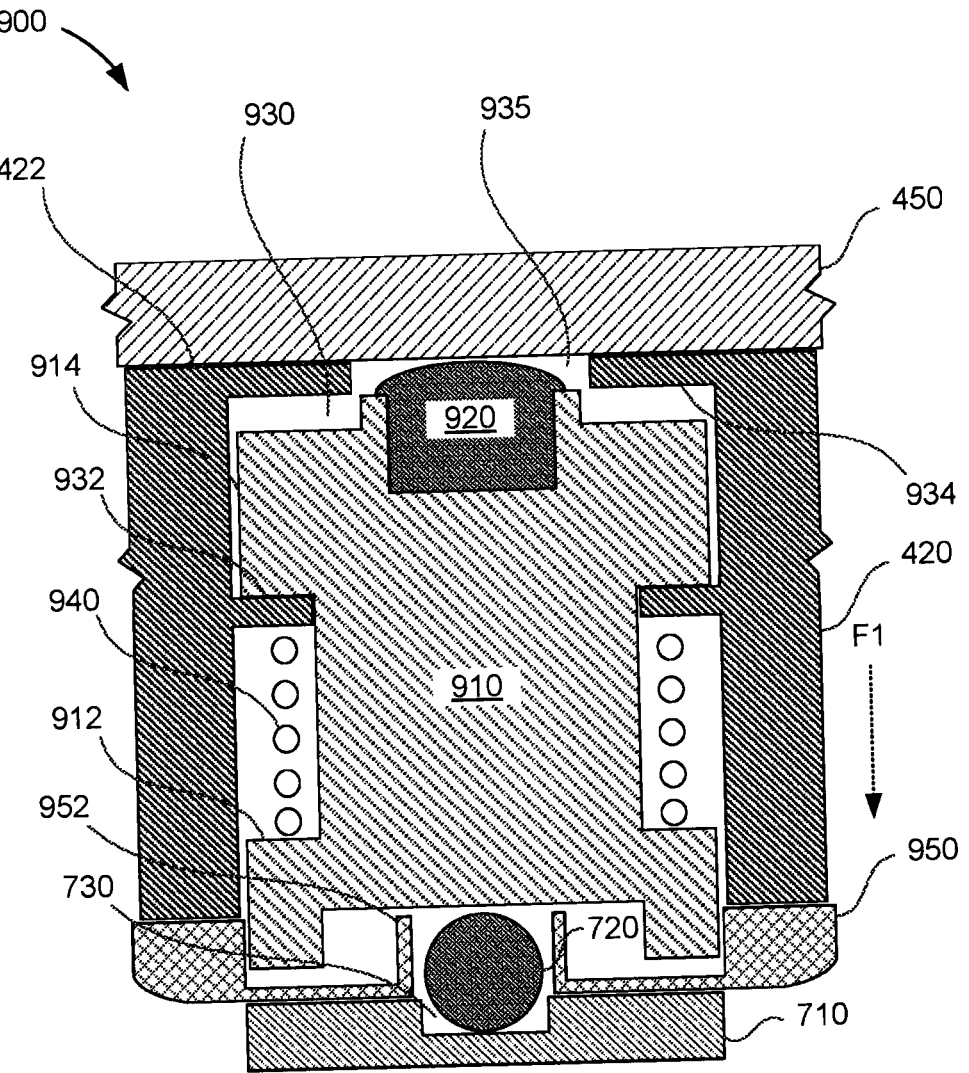
FIGS. 9A and 9B are simplified cross-sectional illustrations of a retractable stub according to some embodiments in the down and up positions, respectively.
Figure 9B:
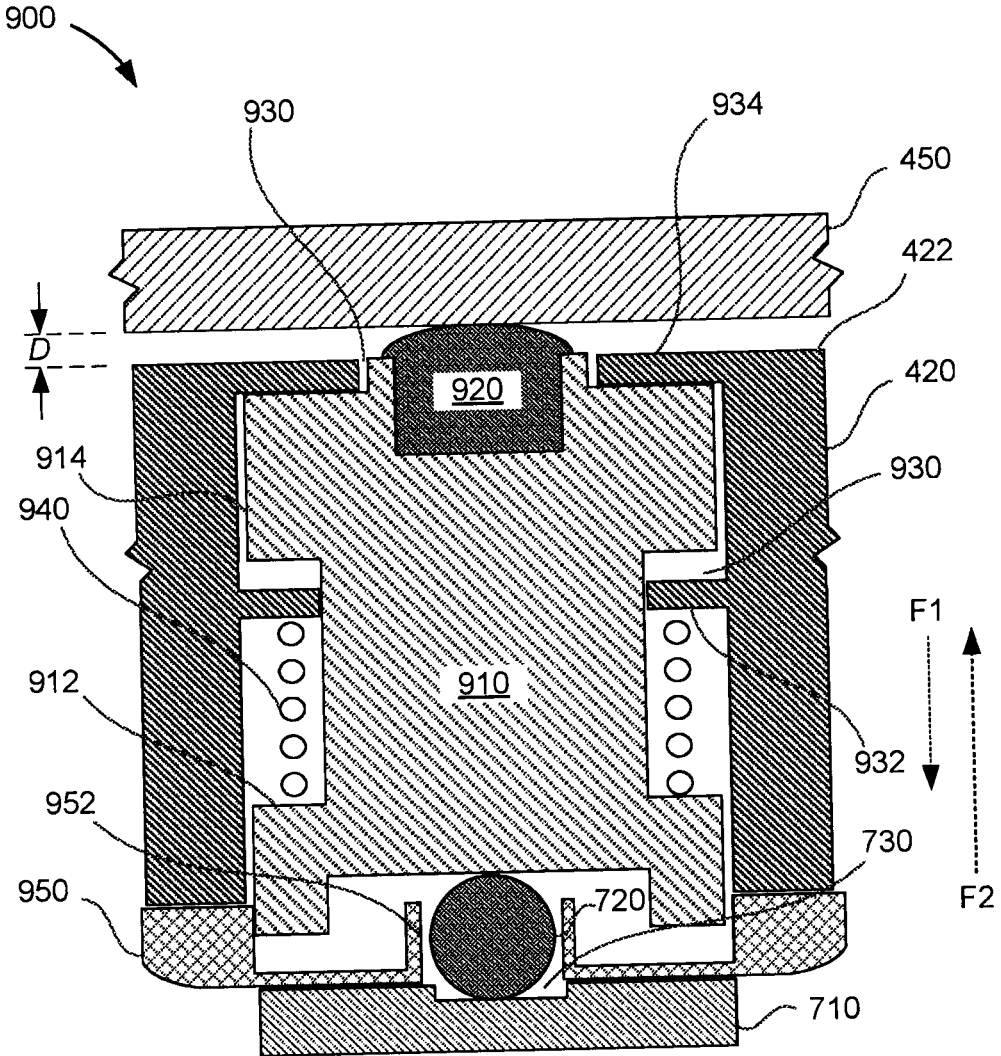

FIGS. 9A and 9B are simplified cross-sectional illustrations of a retractable stub 900 according to some embodiments. Retractable stub 900 can be representative of each of the retractable stubs 440 discussed above. For convenience and ease of illustration, retractable stub 900 is depicted with respect to the support plate 420 and sample 450 shown in FIGS. 4A-5. It is to be understood, however, that while FIGS. 9A and 9B depict particular details of a specific embodiment of the support plate 420, bridge chucks disclosed herein can include support plates that differ in various ways and implementations from the particulars depicted in FIGS. 9A and 9B.

As shown, retractable stub 900 includes a main body portion 910 and a head portion 920 that is coupled to the main body. Main body portion 910 can be made from a rigid material such as a hard rubber, metal or plastic. Head portion 920 can be formed from a hard rubber or similar material that, when wafer 450 is positioned on the head portion 920, provides sufficient friction between the wafer and head portions of the set of retractable pins that sample 450 will not shift or otherwise move with respect to support plate 420 even when the sample is rapidly moved by stage 410 within the processing chamber to position different regions of interest on the sample below the field of view of charged particle column, such as SEM column 120.

Support plate 420 can include multiple cavities 930, corresponding in number to the number of retractable stubs 440. Each cavity includes an opening 935 at the upper surface 422 of the support plate and is sized and shaped to accept one of the retractable stubs 440. FIGS. 9A and 9B depict a single retractable stub 900 positioned within its respective cavity 930. The retractable stub 900 is coupled to, and thus moves in the X, Y and Z directions with support plate 920 when the support plate is moved by stage 410. The retractable stub 900 can also be moved independent of support plate 420 within cavity 930 between a stub down position where head portion 920 is below support surface 422 (depicted in FIG. 9A) and a stub up position where head portion 920 protrudes through opening 935 to a position slightly above support surface 422 (depicted in FIG. 9B) by the interaction of two separate mechanisms: a biasing mechanism 940 and a stub lift mechanism, which in the embodiment depicted in FIGS. 9A and 9B is stub lift mechanism 700 which includes the ball bearing 720 and rotatable ring 710 discussed above with respect to FIG. 7.

Biasing mechanism 940 can be a coil spring or similar device that biases retractable stub 900 in the down (recessed) position such that, absent a stronger opposing force applied by the lift mechanism, head portion 920 is below support surface 422. For example, support plate 420 can include an annular shelf 932 that extends into cavity 930. The biasing mechanism 940 (shown in FIGS. 9A and 9B as a coil spring) is disposed within cavity 930 between a lower surface of the annular shelf 932 and a foot portion 912 of retractable stub 900. In this manner the biasing mechanism 940 provides a force, F1, in the downward direction (represented by the dashed arrow on the right side of FIG. 9A) forcing retractable stub 900 downwards until an arm portion 914 of retractable stub 900 contacts either an upper surface of annular shelf 932 or ball bearding 720. Since FIG. 9A depicts ball bearing 720 in the deep end 732 of recessed track 730, retractable stub 900 is shown in FIG. 9A with arm portion 914 stopped by shelf 932.

In FIG. 9B, ball bearing 720 is in a raised position (i.e., moved to the shallow end 934 of recessed track 930) imparting an upward force, F2, on retractable stub body 910. When force F2 is stronger than force F1, coil spring 940 is compressed and retractable stub 900 is raised upwards until an arm portion 914 of the retractable stub contacts annular shelf 934 that defines opening 935 as shown in FIG. 9B (the "up" or "raised" position). In the up position, head portion 920 protrudes through opening 935 a distance, D, above the upper surface 422 of the support plate such that sample 450 rests on retractable stub 900 instead of resting on planar surface 422 of the support plate.

Also shown in FIGS. 9A and 9B are walls or cage 952 that are part of a ball bearing housing 950. Walls 952 can surround the ball bearing 720 keeping the ball bearing 720 centered beneath retractable stud 900 as the stub actuator system 700 moves ball bearing 720 within trench 730.

In the embodiment depicted in FIGS. 9A and 9B, retractable pin 900 has a generally cylindrical shape (not visible in the cross-sectional views) with a cutout between arm portion 914 and foot 912 that defines an area in which coil spring 940 can be fit. Cavity 930 and opening 935 can have a complimentary shape with interior surfaces that are spaced parallel and close to the outer surfaces of the retractable stub 900. Embodiments are not to any particular shape of the retractable pin 900 and its associated components, however. In other embodiments, retractable pin can have other appropriate shapes including a generally cuboid shape or other appropriate shape.

Figure 10:
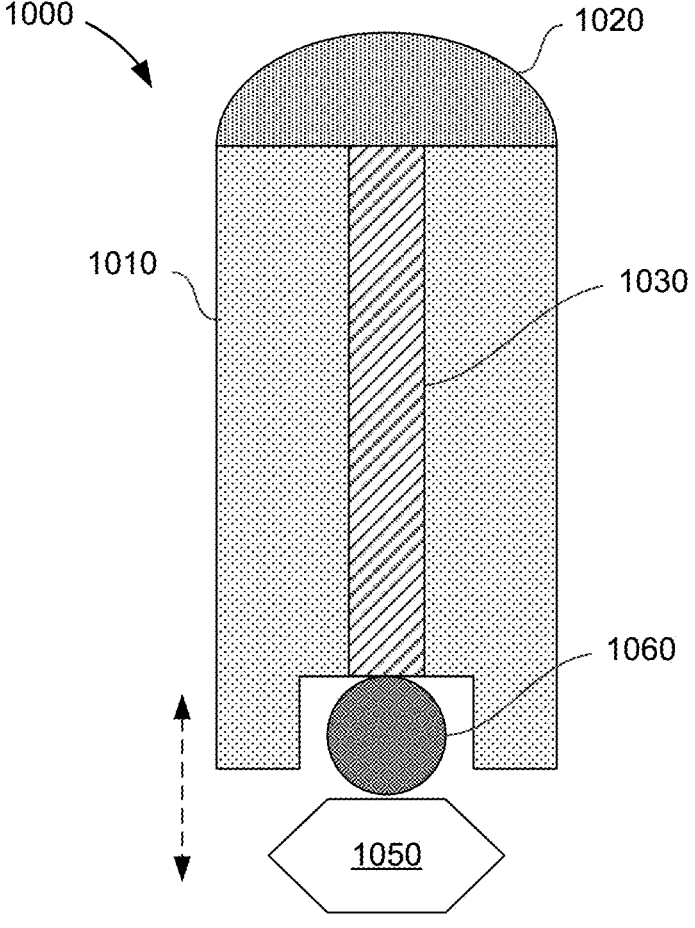
FIG. 10 is a simplified cross-sectional illustration of a retractable stub according to additional embodiments.

While the embodiment shown in FIGS. 9A and 9B includes stub lift mechanism 700 as the lift mechanism, embodiments are not limited to any particular lift mechanism or to any particular design of the retractable stubs and a person of skill in the art will be able to design other appropriate lift mechanisms and other retractable stubs based on the present disclosure. As one example, FIG. 10 is a simplified cross-sectional illustration of a retractable stub 1000 that can be representative of retractable stub 440 and a lift mechanism 1050 that can be a piezoelectric actuator used to raise and lower retractable stub 1000 instead of stub lift mechanism 700. In some embodiments, each individual retractable stub 1000 has a separately controllable lift mechanism 1050 directly below it. In this manner, the height of each individual retractable stub in support plate 420 can be controlled independent of the other retractable stubs enabling the stubs to be used to offset potential warpage within a sample 450.

Additional Embodiments

The foregoing description, for purposes of explanation, used specific nomenclature to provide a thorough understanding of the described embodiments. However, it will be apparent to one skilled in the art that the specific details are not required in order to practice the described embodiments. For example, while examples set forth above discussed an embodiment with two concentric electrodes disposed beneath the sample support 422, embodiments are not limited to any particular number of electrodes or any particular arrangement of the electrodes. In some embodiments, a single electrode can be included while in other embodiments, two or more electrodes can be disposed in arrangements where the electrodes are not concentric. For example, some embodiments can include four pie slice like shaped electrodes each of which is arranged in a different sector of the support plate. As another example, while lift pins 430 were discussed above as being coupled to a portion of stage 410 such that the stage lifts and lowers support plate 420 in the Z direction with respect to the lift pins, in other embodiments the stage or another device can raise and lower the lift pins in the Z direction instead of or in addition to the support plate.

As still another example, while systems described above included a scanning electron microscope as the charged particle column, in other embodiments the charged particle column can be a focused ion beam column and in still other embodiments, the system can include both SEM and FIB columns as part of a SEM/FIB tool.

While different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. It is, therefore, to be understood that the appended claims are intended to cover all such modifications and changes as fall within the true spirit of the embodiments of the disclosure.

Where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

Additionally, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

What is claimed is:

1. A sample support that supports a sample in a processing chamber, the sample support comprising:
   a support plate formed from a dielectric material, the support plate including an upper planar support surface sized and shaped to retain a substrate disposed on the support plate;
   one or more electrodes disposed within the support plate proximate the upper planar support surface;
   a plurality of lift pin holes formed completely through the support plate;

14 a plurality of stub cavities formed within the support plate, each stub cavity having an opening at the upper planar support surface;
   a plurality of retractable stubs corresponding in number to the plurality of stub cavities, wherein each retractable stub is disposed in a unique one of the stub cavities; and
   a stub lift mechanism operable to move each retractable stub in the plurality of stubs between a down position and an up position, wherein in the down position a distal end of the retractable stub is disposed within its respective stub cavity and recessed below the upper planar support surface and the up position the distal end of the retractable stub protrudes above the upper planar support surface through the stub cavity opening; wherein:
   the stub lift mechanism moves all of the retractable stubs in the plurality of retractable stubs between the up and down position together and comprises a rotatable annular body and a plurality of ball bearings;
   each ball bearing in the plurality of ball bearing is positioned below a unique one of the retractable stubs; and
   the stub lift mechanism is operable to apply a force to the ball bearing to move its respective retractable stub in the up position.

2. The sample support set forth in claim 1 wherein:
   the stub lift mechanism further comprises a plurality of recessed tracks formed in the annular ring, each recessed track having a deep end and a shallow end and a sloped surface extending between the deep and shallow ends;
   each ball bearing in the plurality of ball bearing sits within a unique one of the recessed tracks in the plurality of tracks; and
   the stub lift mechanism further comprises an actuator operably coupled to rotate the annular body in first and second opposing directions such that the ball bearing in each recessed track moves up and down in response to the sloped surface.

3. The sample support set forth in claim 2 wherein each retractable stub further comprises a bearing housing that includes one or more walls that surround the bearing positioned below the retractable stub such that the one or more walls prevent the bearing from rotating with the annular body.

4. A system for evaluating a sample, the system comprising:
   a vacuum chamber;
   a sample support disposed within the vacuum chamber and operable to hold a sample during a sample evaluation process;
   a charged particle column configured to direct a charged particle beam into the vacuum chamber toward a sample positioned on the sample support; and
   a moveable stage configured to move the sample support within the vacuum chamber in X, Y and Z directions;
   wherein the sample support comprises:
   a support plate formed from a dielectric material, the support plate including an upper planar support surface sized and shaped to retain a substrate disposed on the support plate;
   one or more electrodes disposed within the support plate proximate the upper planar support surface;
   a plurality of lift pin holes formed completely through the support plate;

a plurality of stub cavities formed within the support plate, each stub cavity having an opening at the upper planar support surface;

a plurality of retractable stubs corresponding in number to the plurality of stub cavities, wherein each retractable stub is disposed in a unique one of the stub cavities; and a stub lift mechanism operable to move each retractable stub in the plurality of stubs between a down position and an up position, wherein in the down position a distal end of the retractable stub is disposed within its respective stub cavity and recessed below the upper planar support surface and the up position the distal end of the retractable stub protrudes above the upper planar support surface through the stub cavity opening;

the stub lift mechanism moves all of the retractable stubs in the plurality of retractable stubs between the up and down position together and comprises a rotatable annular body and a plurality of ball bearings;

each ball bearing in the plurality of ball bearing is positioned below a unique one of the retractable stubs; and the stub lift mechanism is operable to apply a force to the ball bearing to move its respective retractable stub in the up position.

5. The system for evaluating a sample set forth in claim 4 wherein:

the stub lift mechanism further comprises a plurality of recessed tracks formed in the annular ring, each recessed track having a deep end and a shallow end and a sloped surface extending between the deep and shallow ends;

each ball bearing in the plurality of ball bearing sits within a unique one of the recessed tracks in the plurality of tracks; and the stub actuator system further comprises an actuator operably coupled to rotate the annular body in first and second opposing directions such that the ball bearing in each recessed track moves up and down in response to the sloped surface.

6. The system for evaluating a sample set forth in claim 5 wherein each retractable stub further comprises a bearing housing that includes one or more walls that surround the bearing positioned below the retractable stub such that the one or more walls prevent the bearing from rotating with the annular body.

\* \* \* \* \*